United States Patent [19]

Okamoto et al.

[11] 4,099,144
[45] Jul. 4, 1978

[54] INJECTION-LOCKED ULTRA-HIGH FREQUENCY SOLID-STATE OSCILLATOR

[75] Inventors: Hiroshi Okamoto, Tokyo; Mutsuo Ikeda, Tachikawa, both of Japan

[73] Assignee: Nippon Telegraph & Telephone Public Corp., Tokyo, Japan

[21] Appl. No.: 789,220

[22] Filed: Apr. 20, 1977

[30] Foreign Application Priority Data

Apr. 26, 1976 [JP] Japan ............................ 51-47469
Aug. 3, 1976 [JP] Japan ............................ 51-92656

[51] Int. Cl.² .......................................... H03B 7/14
[52] U.S. Cl. ............................ 331/107 R; 331/96; 331/107 G
[58] Field of Search .......... 331/96, 101, 99, 55, 331/107

[56] References Cited

U.S. PATENT DOCUMENTS

| | | | |
|---|---|---|---|
| 3,559,097 | 1/1971 | Chang et al. | 331/101 |
| 3,588,735 | 6/1971 | Chang et al. | 331/101 |
| 3,593,193 | 7/1971 | Chang et al. | 331/96 |
| 3,970,965 | 7/1976 | Shapiro et al. | 331/96 |
| 4,041,412 | 8/1977 | Malone | 331/101 |

*Primary Examiner*—John Kominski
*Attorney, Agent, or Firm*—Flynn & Frishauf

[57] ABSTRACT

An injection-locked ultra-high frequency solid-state oscillator employs an injection locking method in which an ultra-high frequency output power from a solid-state oscillator is stabilized by injecting an output signal from another stable oscillator. The signal injected into the solid-state oscillator has an optional frequency low enough as compared to that of the output power from the solid-state oscillator and is supplied through a bias supplying circuit or the like. Injection of such low-frequency signal produces sideband waves around the oscillation-wave from the solid-state oscillator while one of such sideband waves is trapped by a high-Q cavity resonator provided in the vicinity of a solid-state oscillating element of the solid state oscillator. The oscillation wave from the solid-state oscillator becomes low noise with the sideband wave trapped, and the frequency of the oscillation wave from the solid-state oscillator is made variable in obedience to the variation of the injection signal frequency.

9 Claims, 10 Drawing Figures

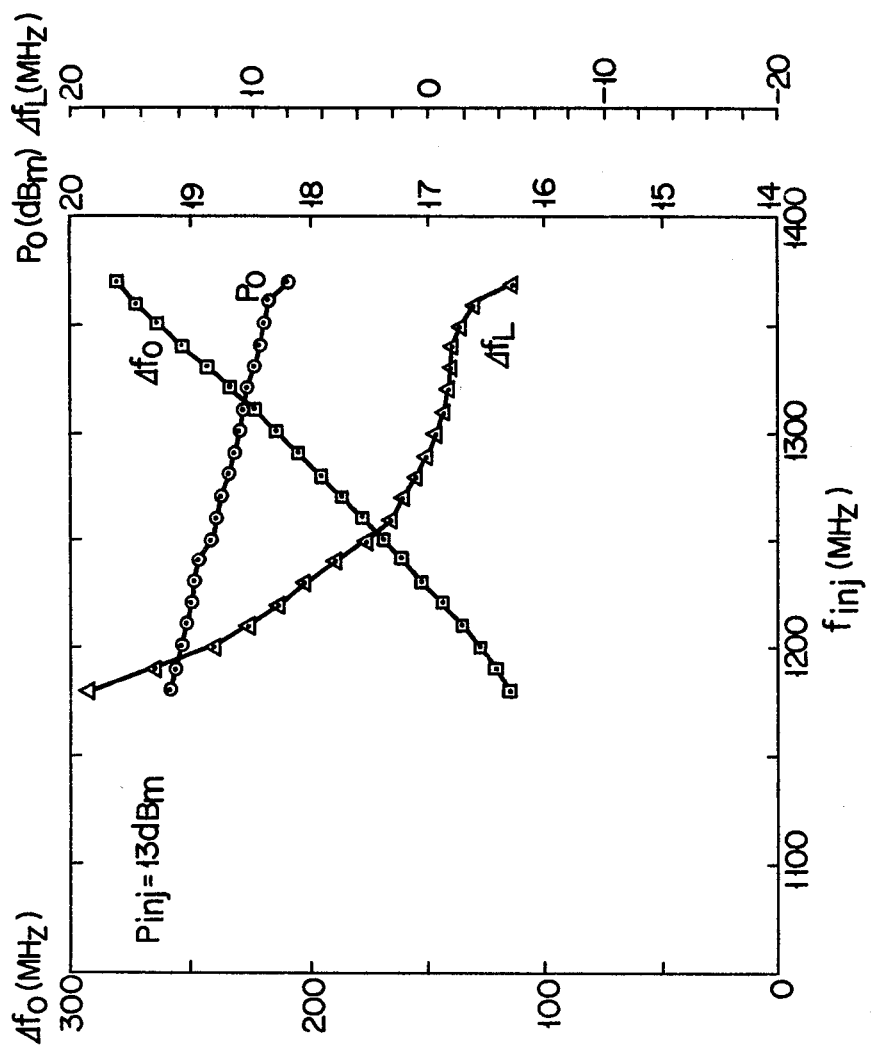
F I G. 5

SPECTRUM OF MAIN OSCILLATING WAVE IN A FREE RUNNING STATE

SPECTRUM OF MAIN OSCILLATING WAVE IN A LOCKING STATE

INJECTION-LOCKED ULTRA-HIGH FREQUENCY SOLID-STATE OSCILLATOR

BACKGROUND OF THE INVENTION

The invention relates to an ultra-high frequency solid-state oscillator stabilized by using an injection locking method, and more particularly to an injection-locked ultra-high frequency solid-state oscillator employing an optional low-frequency injection signal and having wide locking bandwidth.

As for the technique to stabilize and ultra-high frequency solid-state oscillator, such as an IMPATT diode oscillator or a Gunn diode one, two methods have been developed so far. They are the high-Q resonator loading method and the injection locking method:

In the high-Q resonator loading method, noise is reduced by increasing Q of a resonator which is a part of the oscillator. In this method, however, the frequency of the oscillation output cannot be changed otherwise than by mechanically changing the resonant frequency of the high-Q resonator; the oscillator thus stabilized is lacking in the so-called electrical tunability.

Meanwhile, the injection locking method has conventionally been classified roughly into three method. That is, a first method is called a fundamental-wave injection locking method. As shown in FIG. 1, this method is to inject, through a circulator 2 an output power with frequency $f_{inj}$ from an oscillator 3 into the main solid-state oscillator 1 running freely at frequency $f_o$. The frequency $f_{inj}$ of the injection signal may be equal to or very close to the frequency $f_o$ of the main oscillator 1. Here, if the following equation (1) is satisfied between the output power $P_o$ of the main oscillator 1 and the injection signal power $P_{inj}$ of the oscillator 3, the locked state is established and the oscillation frequency $f_o$ of the main oscillator 1 will coincide with the injection signal frequency $f_{inj}$:

$$\left|\frac{\Delta f}{f_o}\right| \leq Q_{ext}^{-1}\left(\frac{P_{inj}}{P_o}\right)^{\frac{1}{2}} \quad (1)$$

Here $Q_{ext}$ is a coupling coefficient between the main oscillator 1 and the external circuit.

In this locking method, upon completion of locking, the main oscillator 1 produces an output power with reduced noise if the injection signal source 3 is stable with relatively low noise. Thus the output power of the oscillator 3 has to have a high frequency-stability. In general, however, as the oscillation frequency increases, it becomes more difficult to realize the oscillator with low noise. Therefore in this method, it is difficult to realize an oscillator which can provide low-noise and stable injection signal at frequency equal or very close to ultra-high frequency solid-state oscillator to be stabilized.

The second injection locking method is called a subharmonic injection locking one. In this method, use is made of the injection signal source 3 whose frequency $f_{inj}$ is nearly equal to $1/n$ of the oscillation frequency $f_o$ of the main ultra-high frequency solid-state oscillator 1

$$\left(f_{inj} = \frac{f_o + \Delta f}{n}\right),$$

here $n = 2, 3, 4 \ldots$ ). The injected signal frequency is multiplied by nth order due to the nonlinearity of the oscillating element in the main oscillator 1, thereby producing a signal with frequency of $f_o + \Delta f$. Here, if the following equation (2) is satisfied between the output power $P_o$ of the main oscillator 1 and the injection power $P_{inj}$ from the injection signal source 3, the locked state is established and the oscillation frequency $f_o$ of the main oscillator 1 coincides with frequency $f_o + f$ which is $n$ times the injection signal frequency $f_{inj}$.

$$|f/f_o| \leq k (P_{inj}/P_o)^{n/2} \ldots \quad (2)$$

here $k$ is a coupling coefficient between the main oscillator 1 and the external circuit.

According to this second locking method, a low-frequency oscillator may be used satisfactorily as the injection signal source. Such low-frequency oscillator can be realized relatively easily. However, this method has a defect that as the order of multiplication ($n \approx f_o/f_{inj}$) is increased, the locking bandwidth is reduced. Here the locking bandwidth means a frequency range within which the frequency of the main oscillator 1 can vary in obedience to the variation of the frequency of the injection signal. According to an experimental example, it is recognized that if $n$ is 9, subharmonic injection locking method is applied to the oscillator operating at 8.5 GHz, and the locking bandwidth $\Delta f$ is reduced substantially to nearly 1 MHz. On the other hand, locking bandwidth $\Delta f$ of the fundamental-wave injection locking method is about 100 MHz or more. This means that in the second method, the oscillation-wave frequency $f_o$ can vary within a very narrow frequency range.

The third method is called a sideband-wave injection locking method. In this method, a low-frequency signal with frequency $f_{inj,1}$ is injected into the main oscillator 1, thereby producing sideband waves with frequencies $f_U = f_o + f_{inj,1}$ and $f_L = f_o - f_{inj,1}$ near the oscillation-wave frequency $f_o$. Another injection signal with a frequency $f_{inj,2}$ near the frequency $f_U$ or $f_L$ is injected into the oscillator 1. One of the side-band wave frequencies, $f_U$ or $f_L$ is, then, locked to the frequency $f_{inj,2}$ according to the fundamental-wave injection locking method. Thus, the frequency $f_o$ of the main oscillation wave itself is stabilized and its sideband noise is reduced, while by fixing the frequency of one of the two injection-wave signal and by changing the frequency of the other, the frequency $f_o$ of the main oscillation wave can be made variable in accordance with the relation $f_o + f_{inj,1} = f_{inj,2}$ or $f_o - f_{inj,1} = f_{inj,2}$.

In this method, however, the frequency $f_{inj,2}$ of the second injection signal must be as high as the main oscillation-wave frequency $f_o$ of the solid-state oscillator 1. It is, therefore, difficult to realize the second injection signal source.

Accordingly, an object of this invention is to provide an injection-locked ultra-high frequency solid-state oscillator capable of using a low-frequency injection signal source, having wide locking bandwidth and having electrical tunability.

SUMMARY OF THE INVENTION

In order to achieve the above-stated object, the oscillator of this invention comprises an ultra-high frequency solid-state oscillator, an injection signal source, and a high-Q cavity resonator.

The frequency of the injection signal is arbitrary, and, therefore, may be much lower than the frequency of the solid-state oscillator to be locked. The injection signal is supplied to the solid-state oscillator through its bias supplying circuit.

The high-Q cavity resonator is located in the vicinity of the ultra-high frequency oscillator element. Its resonant frequency is selected in the vicinity of the frequency of one of the sideband waves appeared around the main oscillation-wave of the solid-state ultra-high frequency oscillator when supplying the injection signal.

The coupling factor of the high-Q cavity is selected to be such a amount that the cavity can trap the sideband wave whose frequency is in the civinity of the resonant frequency of the cavity.

By these elements provided, as described later, the main oscillation-wave can become low noise and its frequency can be varied linearly in obedience to the variation of the injection signal frequency.

According to this invention, it is possible to use a cheap, highly reliable, and easily available low-frequency oscillator as an injection signal source for locking of the ultra-high frequency solid-state oscillator body. Here, the locking bandwidth may be wide despite the low frequency of the injection signal.

Moreover, since the frequency of the injection signal is in the vicinity of the frequency $|f_o - f_i|$ i.e. the difference between the oscillation-wave frequency $f_o$ of the solid-state oscillator and the resonant frequency $f_i$ of the high-Q cavity resonator, the frequency of the injection signal may be selected by determining suitably the resonant frequency $f_i$ of the high-Q cavity resonator.

In addition, since the injection signal source can be of low-frequency, it is easy to provide it with electronic tunability. In such construction, the solid-state oscillator with the frequency varying in obedience to the frequency of the injection signal may also be electronically tunable. Thus, according to this injection locking method, the ultra-high frequency solid-state oscillator with the above-stated advantages may be obtained.

BRIEF DESCRIPTION OF THE DRAWINGS

This invention can be more fully understood from the following detailed description when taken in conjunction with the accompanying drawings, in which:

FIG. 5 shows characteristic curves within the locking bandwidth of another embodiment of this invention.

DETAILED DESCRIPTION

Figure 1:
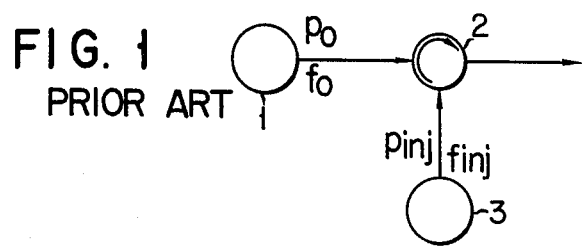
FIG. 1 is a schematic block diagram illustrating the conventional injection locking method for an ultra-high frequency solid-state oscillator.

By referring to the drawings, description will be given below of an embodiment of this invention. In the block diagram of an embodiment of the invention shown in FIG. 2, an ultra-high frequency solid-state oscillator 1 is an IMPATT diode oscillator or a Gunn diode oscillator.

Since the aim of this invention can be achieved as well when a Gunn diode oscillator is used in place of an IMPATT diode oscillator, the description below is limited only to the case of an IMPATT diode oscillator. An IMPATT diode 2 used may be of, for example, a GaAs Schottky-barrier type. This oscillating element is mounted on a coaxial-waveguide type diode mount 3. Here, to the oscillating element, DC bias current is supplied from the coaxial side, and an oscillation output is taken out from the waveguide side. That is, the coaxial side of the mount 3 is connected with a DC bias source 5 through a bias-T 4 composed of L and C. The other side of the bias-T 4 is connected with a low-frequency injection signal source 7 through an isolator 6. The frequency and power of the injection signal may be measured by means of a frequency counter 8 and a power meter 9 provided between the mount 3 and the bias-T 4. Meanwhile, on the waveguide side is provided a short piston 10 coupled to the mount 3 as an adjustable circuit element for impedance matching of diode to load. In the vicinity of the mount 3 is provided a high-Q cavity resonator 12 through a waveguide spacer 11. The waveguide spacer 11 is connected to a waveguide switch 16 through an isolator 14 and a variable attenuator 15. The change of the frequency of the main oscillator-wave of the diode oscillator 1 and the change of the spectrum of the oscillation-wave due to the injection of the low-frequency signal may be observed with a spectrum analyzer 17 located on one branch of the waveguide switch 16. The other branch of the wave guide switch 16 is connected to a frequency meter 18 and a power meter 19 for detecting the frequency and the output power of the main oscillation-wave, respectively.

In the above-mentioned embodiment, the IMPATT diode oscillator 1 has, for example, such performance that the oscillation frequency $f_o = 36.7$ GHz and the oscillation output power $P_o = 19.2$ dBm in the free-running state, when the DC bias current supplied by the DC bias source 5 to the IMPATT diode 2 is: $I_{DC} = 85$ mA.

Figure 3A:
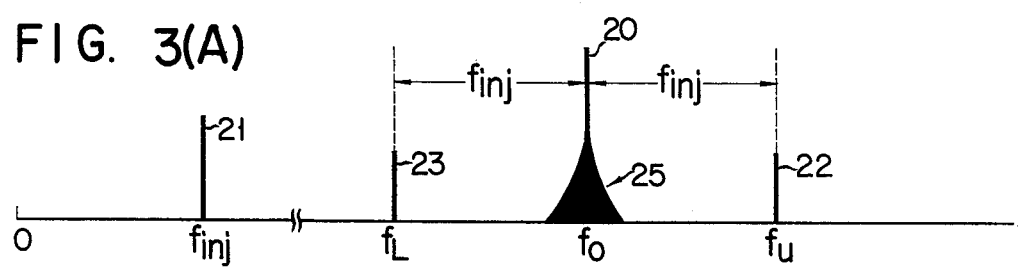
FIGS. 3(A) to 3(C) are diagrams illustrating the relations between the frequencies of the various signals for the purpose of describing the principle of this invention.
Figure 3B:
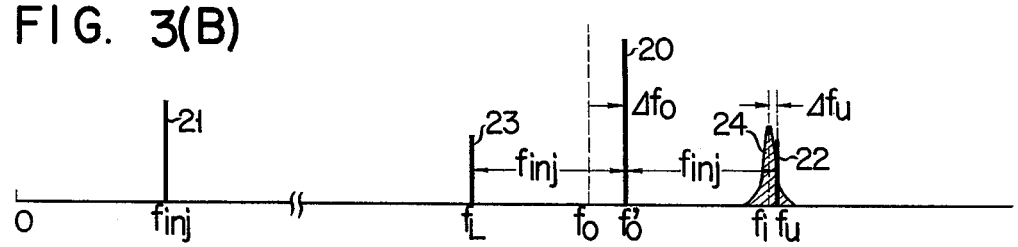
Figure 3C:
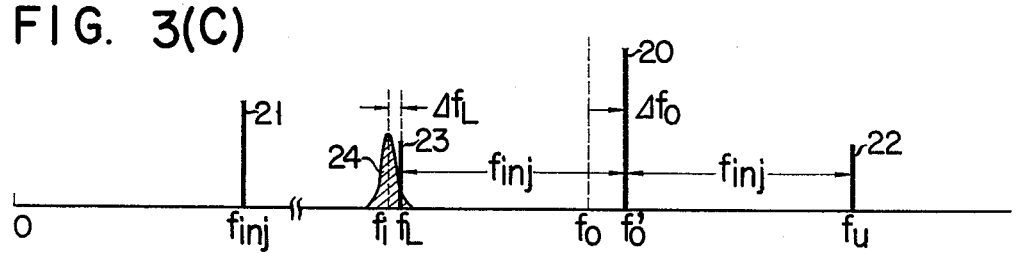
Figure 4:
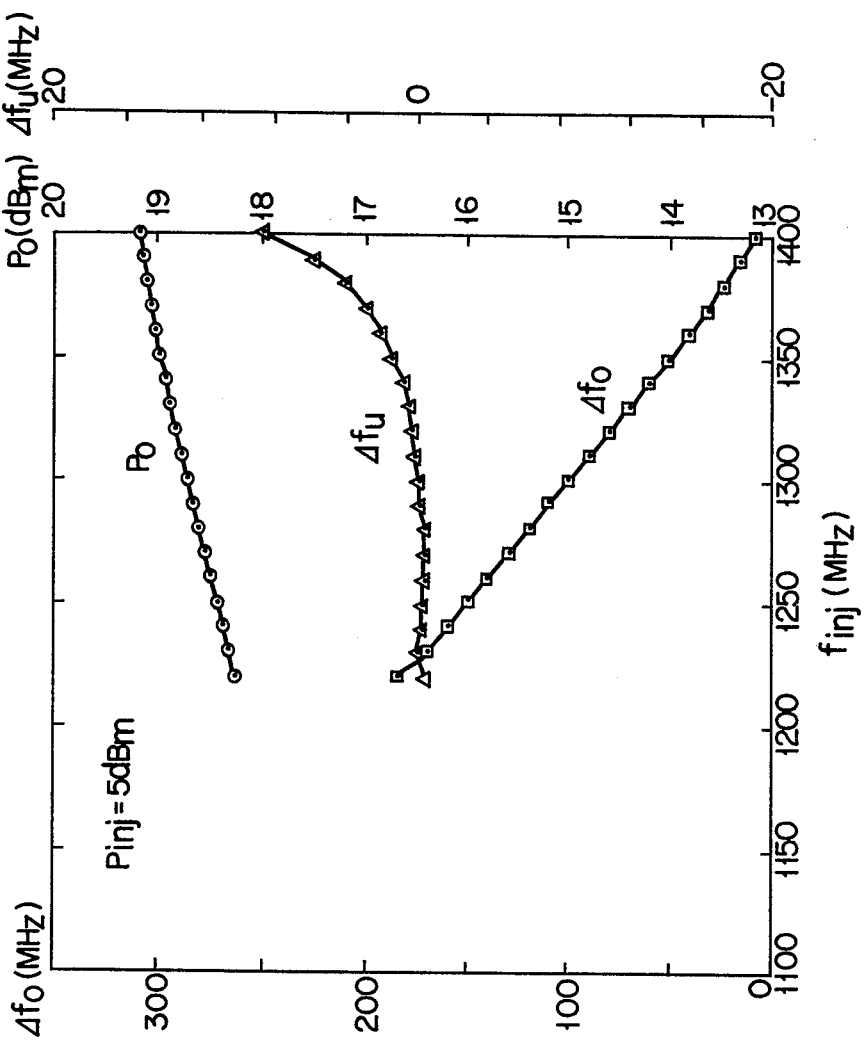
FIG. 4 shows characteristic curves within the locking bandwidth of an embodiment of this invention.

First, as shown in FIG. 3(A), a spectrum 20 of the frequency of the oscillation-wave $f_o$ is observed on the spectrum analyzer 17. In this state, a signal 21 from the injection signal source whose frequency $f_{inj}$ is much lower than the oscillation-wave frequency $f_o$, e.g. 2GHz or lower, is injected into the IMPATT diode 2 through the isolator 6 and the bias-T 4. Injection of this signal 21 modulates the oscillation-wave output 20, thereby producing sideband waves with frequency of $f_U = f_o + f_{inj}$ (22) and frequency of $f_L = f_o - f_{inj}$ (23) as shown in FIG. 3(A). Then, the resonant frequency $f_i$ of the high-Q cavity resonator 12 is set at a frequency 24 (FIGS. 3(B) and 3(C)) equal to or very close to one of these sideband-wave frequencies $f_U$ or $f_L$. FIG. 3(B) illustrates a case in which the resonant frequency $f_i$ is set close to $f_U$, while FIG. 3(C) illustrates a case in which $f_i$ is set close to $f_L$. In each of these cases, due to the nonlinearity of the oscillating diode, a parametric interaction occurs between the oscillation-wave frequency $f_o$, (20), and the injection signal frequency $f_{inj}$ (21), and the side-band wave frequency $f_U$ (22) or $f_L$ (23) which is in the vicinity of the resonant frequency $f_i$ (24) of the high-Q cavity. That is, when the frequency $f_{inj}$ of the injection-wave signal 21 is varied, the frequency $f_U$ or $f_L$ of the sideband-wave 22 or 23 which is in the vicinity of the resonant frequency $f_i$ (24) of the high-Q cavity is trapped by the high-Q resonator 12 and prevented from varying. As a result, the oscillation-wave frequency $f_o$ comes to vary in obedience to the variation of the injection-wave frequency $f_{inj}$. In FIGS. 3(B) and 3(C), the frequency of the oscillation-wave 20 after variation in obedience to the variation of the injection-wave frequency $f_{inj}$ is denoted by $f'_o$. The parametric interaction described above is referred to as parametric injection locking here. Referring now to FIGS. 4 and 5, such parametric injection locking will be further described. FIG. 4 shows the properties within the locking bandwidth in the case of FIG. 3(B) where $f_i$ is set in the vicinity of $f_U$. FIG. 5 shows those in the case of FIG. 3(C) where $f_i$ is set in the vicinity of $f_L$.

As shown in FIG. 3(B), the resonant frequency $f_i$ of the resonant cavity 12 is set at a frequency near the frequency $f_U$ of the upper-sideband wave 22 produced concurrently with the lower sideband wave 23 as a result of supplying of the injection signal 21. In this case, when the frequency $f_{inj}$ of the injection signal 21 is varied, the frequency $f_U$ of the upper-sideband wave 22 is trapped in the vicinity of the resonant frequency $f_i$ and is not affected by the change of the frequency $f_{inj}$ of the injection signal 21. This can be seen by observing that $\Delta f_U = f_U - f_i$ plotted by $\Delta$ in FIG. 4 is kept substantially at a constant value or 0 independently of the change of such frequency $f_{inj}$. When the frequency $f_{inj}$ of the injection signal 21 is varied in this case, the frequency $f'_o$ of the oscillation-wave 20 varies linearly in obedience to the variation of the frequency $f_{inj}$. This is clearly seen in FIG. 4 by observing that the variation of the oscillation-wave frequency $\Delta f_o = f'_o - f_o$ plotted by $\square$ increases substantially linearly when decreasing the frequency $f_{inj}$. Further, more the curve plotted by $\odot$ in FIG. 4 illustrates the output power $P_o$ of the oscillation-wave 20 from the IMPATT diode oscillator 1, which decreases by not more than 1 dB when the frequency is changed from 1400MHz to 1220MHz.

Meanwhile, the locking properties as shown in FIG. 5 corresponds to the case illustrated by FIG. 3(C) where the resonant frequency $f_i$ of the cavity resonator 12 is set at a frequency near the frequency $f_L$ of the lower-sideband wave 23. Also in this case, it is obvious that the same parametric injection-locking relationship as mentioned above is established between the frequency $f'_o$ of the oscillation wave 20, the frequency $f_{inj}$ of the injection wave 21, and the frequency $f_L$ of the sideband wave 23. That is, when the frequency $f_{inj}$ of the injection signal 21 is gradually increased, the frequency deviation $\Delta f_L = f_L - f_i$ of the lower-sideband wave from the resonant frequency $f_i$ of the high-Q cavity 12 is kept substantially constant and the variation of the frequency $f'_o$ of the oscillation-wave output, $\Delta f_o = f'_o - f_o$, increases substantially linearly. Here, $P_o$ indicates the output power of the IMPATT diode oscillator 1, and it decreased by only 1 dB or less.

In either case illustrated in FIG. 4 or FIG. 5, the parametric injection locking method by using an electrically tunable injection signal source 7 makes the IMPATT diode oscillator 1 also electrically tunable. It is a rather easy task to realize an electrically tunable injection signal source 7, because the frequency of it is much lower than that of the IMPATT diode oscillator 1.

Furthermore, the locking bandwidth or the frequency range in which the frequency $f'_o$ of the oscillation-wave 20 may be varied in obedience to the variation of the injection signal frequency $f_{inj}$ is about 180 MHz in the example shown in FIG. 4. 300 MHz or more of the locking bandwidth is obtained in another example. This may suggest that the locking bandwidth in the parametric injection locking method of this invention is much larger than the locking bandwidth in the case of the aforementioned subharmonic injection locking method and is as large as that in the case of the aforesaid fundamental-wave injection locking method.

Figure 6A:
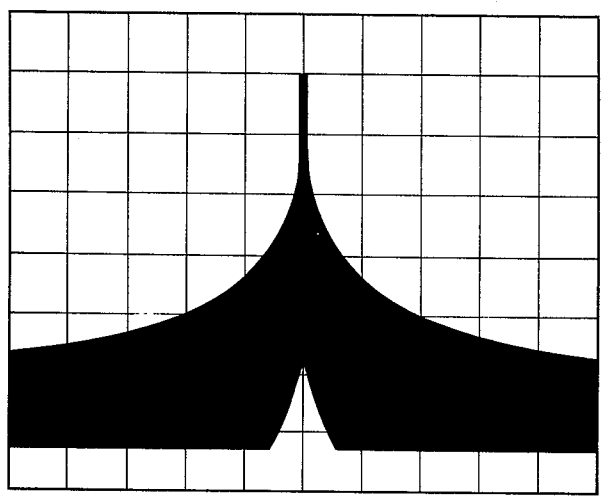
FIGS. 6(a) and 6(b) show the spectra of oscillation-wave for illustrating the technical effect of this invention.
Figure 6B:
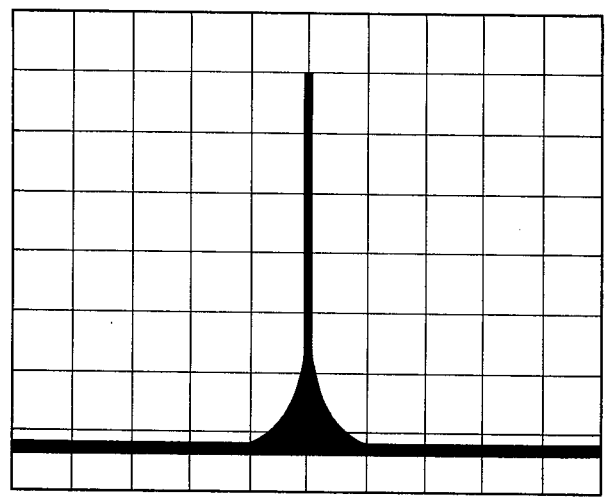

Furthermore, the sideband noise (indicated by 25 in FIG. 3(A)) of the oscillation-wave, is decreased remarkably by the existence of the high-Q resonator 12. FIGS. 6(a) and 6(b) illustrate experimental examples of the oscillation-wave spectrum in the free-running state and that in the locked state, respectively. In either case, the abscissa is 1MHz/div. and the ordinate is 10 dB/div. It is clear from the comparison of the two drawings that the sideband noise 25 of the oscillation-wave 20 in the locked state is lower by nearly 25 dB as compared to that in the free-running state. The amount of such noise reduction increases as Q of the cavity resonator 12 increases.

Although, in the above-mentioned embodiment, use is made of an IMPATT diode oscillator as the solid-state oscillator, this invention is not limited to such type of oscillator, and the perfectly same parametric injection locking property can be realized when a Gunn diode oscillator is used in place of the IMPATT diode oscillator.

Figure 2:
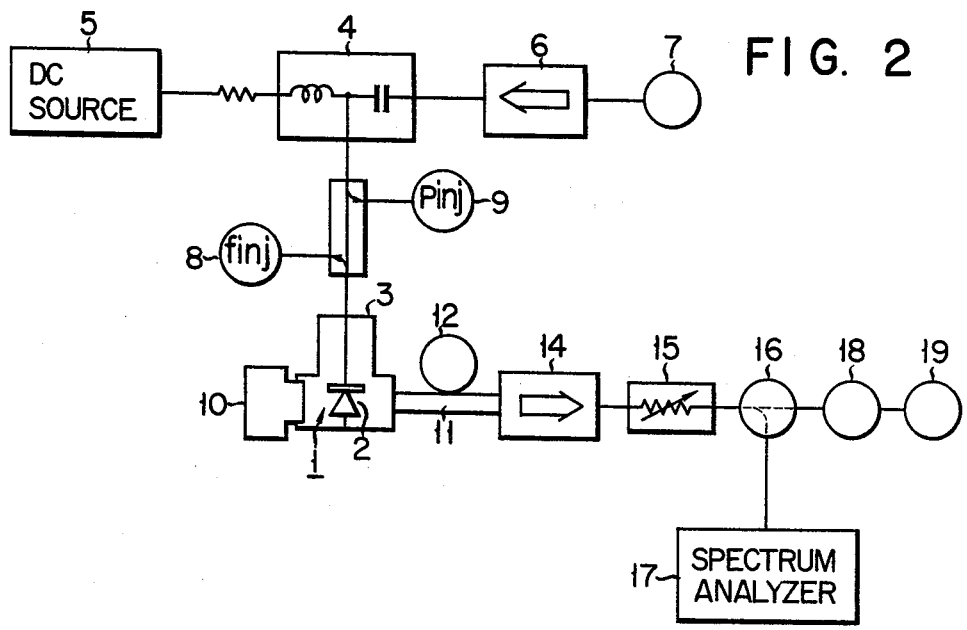
FIG. 2 is a block diagram of an embodiment of this invention.
Figure 7:
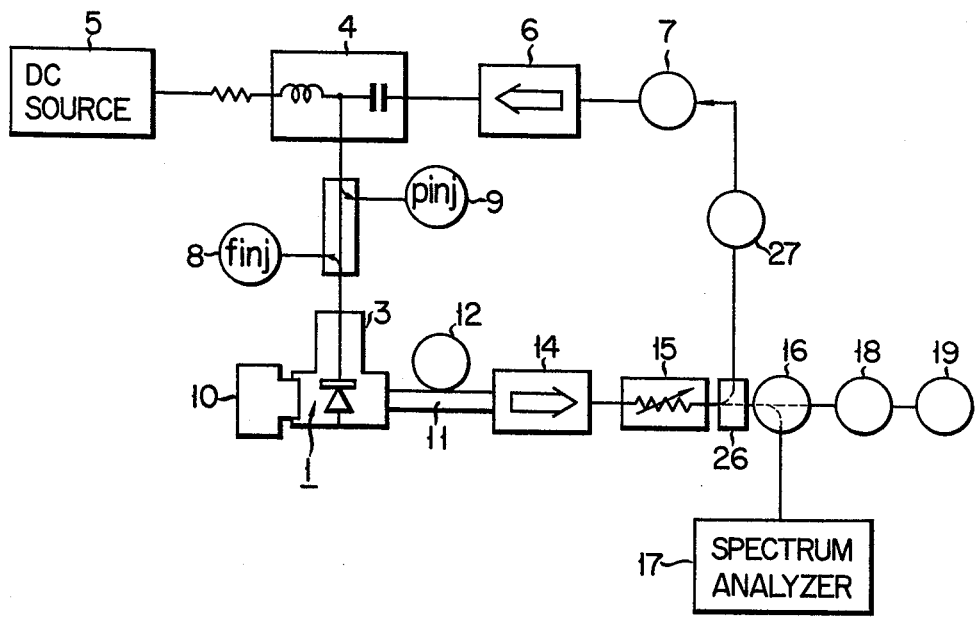
FIG. 7 is a block diagram illustrating an applied example of this invention.

In the injection-locked ultra-high frequency solid-state oscillator of the invention using the above-mentioned parametric injection locking method, a circuit section for automatic frequency control may be added to the circuit configuration of FIG. 2, in order to stabilize further the oscillation-wave frequency $f'_o$. For example, as shown in FIG. 7, a part of the output power from the IMPATT diode oscillator 1 is picked up with a directional coupler 26 and fed to a frequency discriminator 27. The frequency discriminator 27 is mainly composed of e.g. high-Q cavity resonator, and produces an electric signal in proportion to a drifting deviation $\delta f_o$ of the frequency $f'_o$ of the oscillation-wave 20 from the solid-state oscillator 1. Such an electric signal is supplied to the injection signal source 7, thereby changing its frequency $f_{inj}$ so as to eliminate the drift $\delta f_o$. Namely, the frequency of the oscillation-wave 20 from the ultra-high frequency solid-state oscillator 1 may be stabilized by automatically changing the frequency $f_{inj}$ of the injection signal in obedience to the drifting deviation of the oscillation-wave frequency $f'_o$.

Another applied example is an up-converter with power gain. In this application, the injection signal 21 is regarded as an input signal, and the oscillation-wave 20 is regarded as an output signal. The embodiment of this invention shown in FIG. 2 can be regarded as an up-converter, in which the input signal frequency $f_{inj}$ is up-converted to the frequency $f'_o$ of the output signal. As shown in FIG. 4 or FIG. 5, input power or injection signal power $P_{inj}$ is 5 dBm in FIG. 4 and 13 dBm in FIG. 5. These values are much lower than the power $P_o$ of the output signal, which is 18ε19 dBm. In other words, this up-converter has power gain.

Furthermore, it can be seen from the linear dependence of the frequency variation $\Delta f_o$ of the oscillation-wave upon the change of the injection signal frequency $f_{inj}$ as shown in FIG. 4 and FIG. 5 that if the input signal is FM-modulated, an FM-modulated output signal can be obtained from the ultra-high frequency solid-state oscillator.

As may be clear from the above description, in the injection-locked ultra-high frequency solid-state oscillator of the invention using the parametric injection locking method, there appear various sideband waves with frequencies of $f = f_{o'} \pm n \times f_{inj}$ (here $n = 1, 2, 3 \ldots$) around the oscillation-wave with frequency $f_{o'}$. Since these sideband waves may be removed easily by using a band-pass filter, they do not present any practical hindrances.

What we claim is:

1. An injection-locked ultra-high frequency solid-state oscillator comprising a solid-state oscillator including an oscillating element operative at ultra-high frequency; a bias supplying circuit connected to said solid-state oscillator for supplying bias current to said oscillating element; a low-frequency signal source connected to said solid-state oscillator for generating a low-frequency output power which is injected into said solid-state oscillator element through said bias supplying circuit; and a high-Q cavity resonator located in the vicinity of said solid-state oscillator body, having its resonant frequency in the vicinity of the frequency of one of sideband-waves produced accompanying an oscillation-wave from said solid-state oscillator when supplying the low-frequency signal, and trapping said one of the sideband waves.

2. An injection-locked ultra-high frequency solid-state oscillator according to claim 1 wherein said solid-state oscillator element is an IMPATT diode.

3. An injection-locked ultra-high frequency solid-state oscillator according to claim 1 wherein said solid-state oscillator element is a Gunn diode.

4. An injection-locked ultra-high frequency solid-state oscillator according to claim 1 wherein said oscillating element in said solid-state oscillator body is housed in a mount.

5. An injection-locked ultra-high frequency solid-state oscillator according to claim 4 wherein said mount is a coaxial-waveguide type diode mount.

6. An injection-locked ultra-high frequency solid-state oscillator according to claim 1 wherein said bias supplying circuit includes a DC power source to generate DC bias current.

7. An injection-locked ultra-high frequency solid-state oscillator according to claim 1 wherein said high-Q cavity resonator is mounted on the output line of said solid-state oscillator body through a waveguide spacer.

8. An injection-locked ultra-high frequency solid-state oscillator according to claim 6 wherein said high-Q cavity resonator has a resonant frequency substantially equal to the frequency of an upper-sideband wave among said sideband waves.

9. An injection-locked ultra-high frequency solid-state oscillator according to claim 6 wherein said high-Q cavity resonator has a resonant frequency substantially equal to the frequency of a lower-sideband wave among said sideband waves.

* * * * *